United States Patent
Brudzynsky et al.

(10) Patent No.: US 10,032,579 B2
(45) Date of Patent: Jul. 24, 2018

(54) COMPOSITE ROCKER BUTTON WITH CAPACITIVE SENSE TECHNOLOGY

(71) Applicant: Continental Automotive Systems, Inc., Auburn Hills, MI (US)

(72) Inventors: Daniel Arthur Brudzynsky, Waterford, MI (US); Orthell LaVount Adams, Ypsilanti, MI (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 200 days.

(21) Appl. No.: 14/576,901

(22) Filed: Dec. 19, 2014

(65) Prior Publication Data

US 2016/0181033 A1    Jun. 23, 2016

(51) Int. Cl.
*H01H 9/00* (2006.01)
*H01H 23/00* (2006.01)
*H03K 17/98* (2006.01)
*H01H 23/12* (2006.01)

(52) U.S. Cl.
CPC ............ *H01H 23/006* (2013.01); *H03K 17/98* (2013.01); *H01H 23/12* (2013.01); *H01H 2221/016* (2013.01)

(58) Field of Classification Search
CPC ............ H01H 23/006; H01H 2221/016; H01H 23/12; H03K 17/98
USPC ...................................... 200/4, 600
See application file for complete search history.

(56) References Cited

U.S. PATENT DOCUMENTS

| | | | |
|---|---|---|---|
| 5,719,361 A | 2/1998 | Lee | |
| 8,476,542 B2* | 7/2013 | Hagiwara | G06F 3/0338 200/5 R |
| 2002/0190727 A1* | 12/2002 | Morimoto | G01L 5/165 324/661 |
| 2010/0101924 A1* | 4/2010 | Wu | H01H 9/0271 200/339 |

FOREIGN PATENT DOCUMENTS

| | | |
|---|---|---|
| CN | 101354974 A | 1/2009 |
| JP | H1153983 A | 2/1999 |

* cited by examiner

*Primary Examiner* — Edwin A. Leon
*Assistant Examiner* — Lheiren Mae A Caroc (57) ABSTRACT

A rocker panel button arrangement having a bezel with an opening. A rocker button is rotatably mounted to the bezel and is located within the aperture. The rocker button is pivotable about an axis between a first position, a second position and a neutral position. The rocker button also includes a viewing surface and a back side. A capacitive film is connected to the back side of the rocker. A chassis is connected and supports the capacitive film and is also connected to and movable with the rocker button. A circuit board is connected to the bezel adjacent the chassis. The circuit board is connected to the bezel in such a manner that the chassis, capacitive film and rocker button may rotate freely near the circuit board. Between the chassis and the circuit board is a rocker actuator that may take several forms.

11 Claims, 6 Drawing Sheets

000
COMPOSITE ROCKER BUTTON WITH CAPACITIVE SENSE TECHNOLOGY

FIELD OF THE INVENTION

The present invention relates to a composite rocker button arrangement providing capacitive touch and mechanical feedback to a user.

BACKGROUND OF THE INVENTION

In the field of instrumentation design, with particular reference to vehicle interiors, there are often a number of different mechanical buttons or capacitive nodes in the interior of the vehicle that function to operate switches or control other vehicle functions. The mechanical buttons utilized in vehicle interiors often provide a user of the button with mechanical feedback. For example, when a user pushed the button, they can feel a click, detent, or some type of other mechanical feedback in their fingertips when the button is pushed. Such mechanical buttons have gaps around the edges that visually disrupt a smooth surface. A surface with capacitive button nodes offers a seamless surface, which is visually desirable, however, no mechanical feedback is provided to the user. Existing technologies that address this issue often utilize a high cost "clicker module" or some other type of module that contains mechanical components in order to provide the user with the type of touch feedback that is commonly associated with such buttons. It is therefore desirable to develop lower cost button arrangements that provide the user with the same type of mechanical feedback, while eliminating some of the more expensive components found in the prior art. Additionally, it is desirable to include additional features on the mechanical button, such as touch or function nodes that allow for a user of the button to select certain functions by touching a specific area on the button and then using the mechanical feature of the button in order to control the function mode selected.

SUMMARY OF THE INVENTION

The present invention is directed to a rocker panel button arrangement having a bezel with an opening. A rocker button is rotatably mounted to the bezel and is located within the opening. The rocker button is pivotable about an axis between a first position, a second position and a neutral position. The rocker button also includes a viewing surface and a back side. A capacitive film is connected to the back side of the rocker button and is visible through the viewing surface of the rocket button. A chassis is connected and supports the capacitive film and is also connected to and movable with the rocker button. A circuit board is connected to the bezel adjacent the chassis. The circuit board is connected to the bezel in such a manner that the chassis, capacitive film and rocker button may rotate freely near the circuit board.

Between the chassis and the circuit board is a rocker actuator that may take several forms. The rocker actuator is operated by the pivoting of the rocker button between the first position and the second position, such that a first command signal is initiated by disrupting the capacitive field of a particular button node on the rocker button. A second command signal is initiated from the rocker actuator and circuit board when the rocker button pivots to the first or second position.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
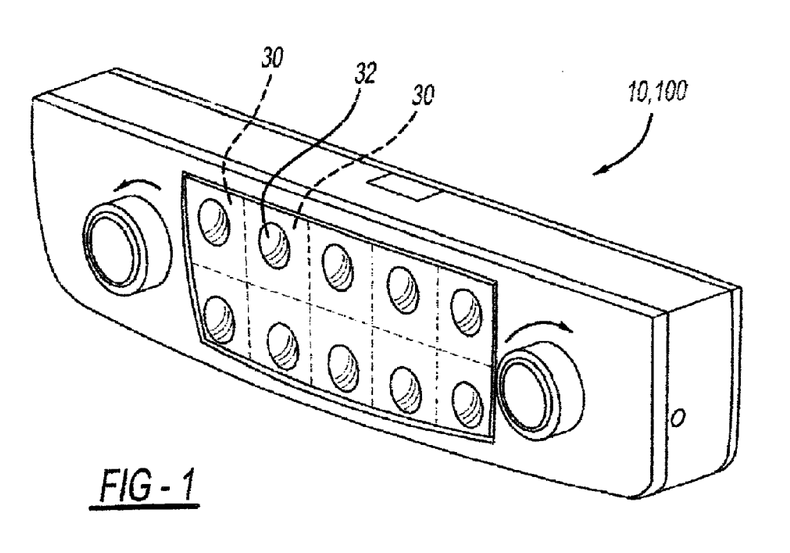
FIG. 1 is a perspective front view of the composite rocker panel button arrangement in accordance with the present invention.
Figure 2:
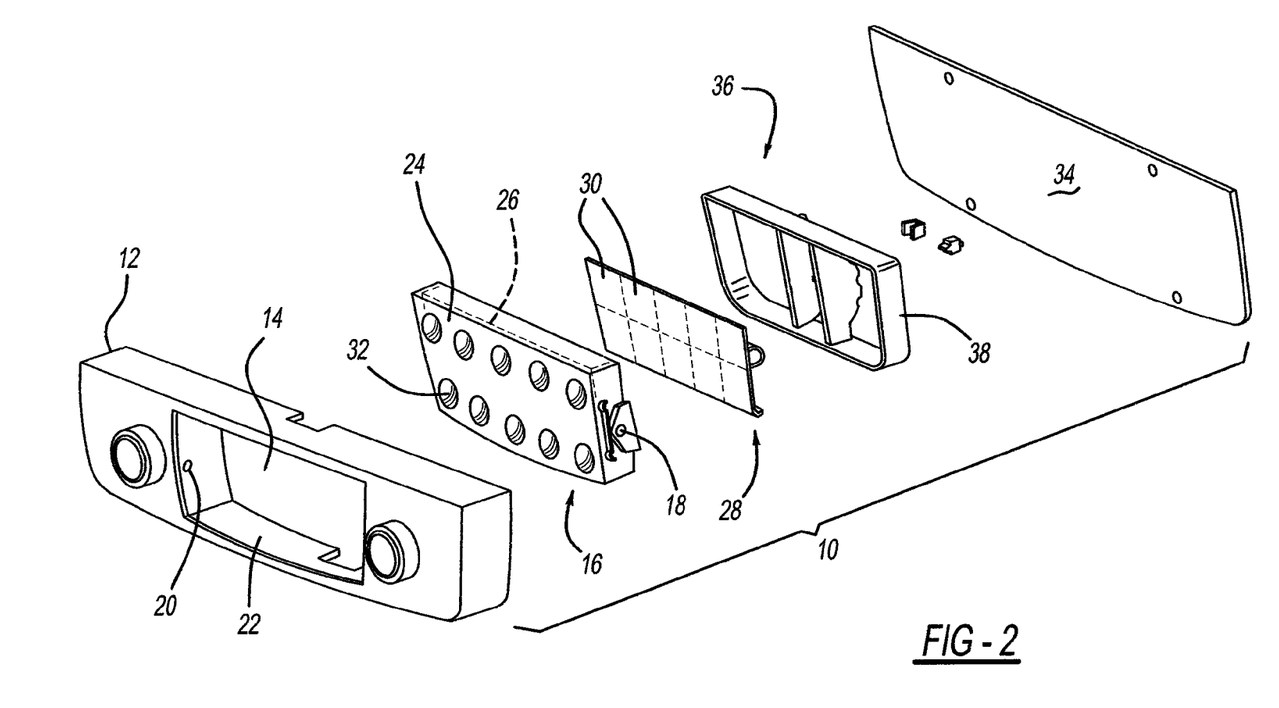
FIG. 2 is an exploded side perspective view of the composite rocker panel button arrangement in accordance with a first embodiment of the invention.
Figure 3A:
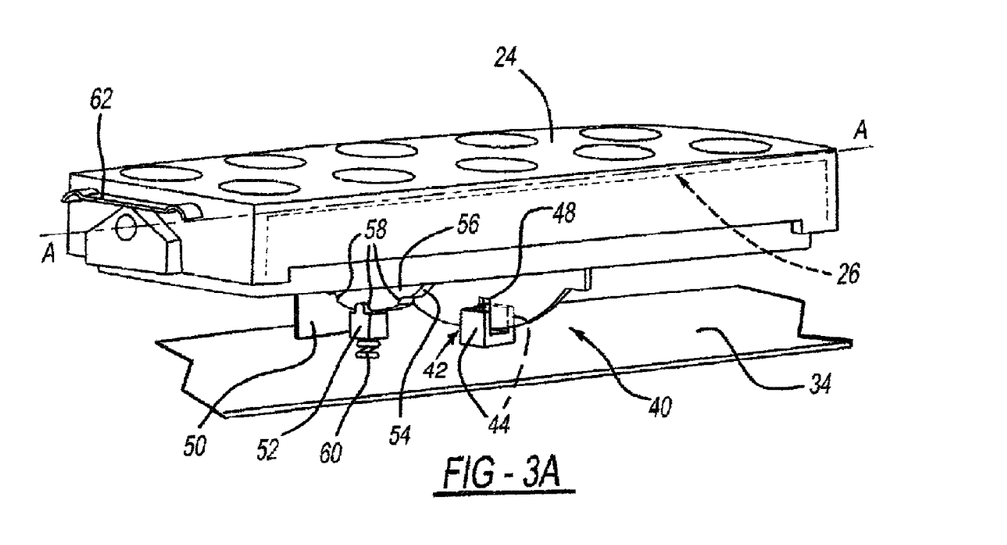
FIG. 3A is a partially sectioned side perspective view of the rocker panel button arrangement in accordance with the first embodiment of the invention.
Figure 3B:
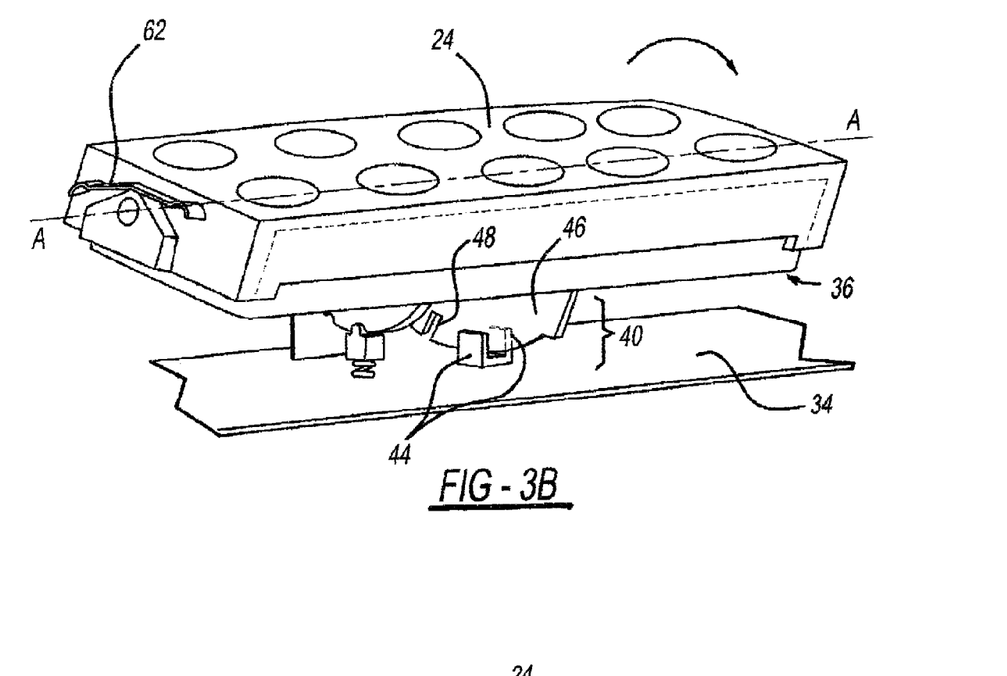
FIG. 3B is a partially sectioned side perspective view of the rocker panel button arrangement in accordance with the first embodiment of the invention.
Figure 4:
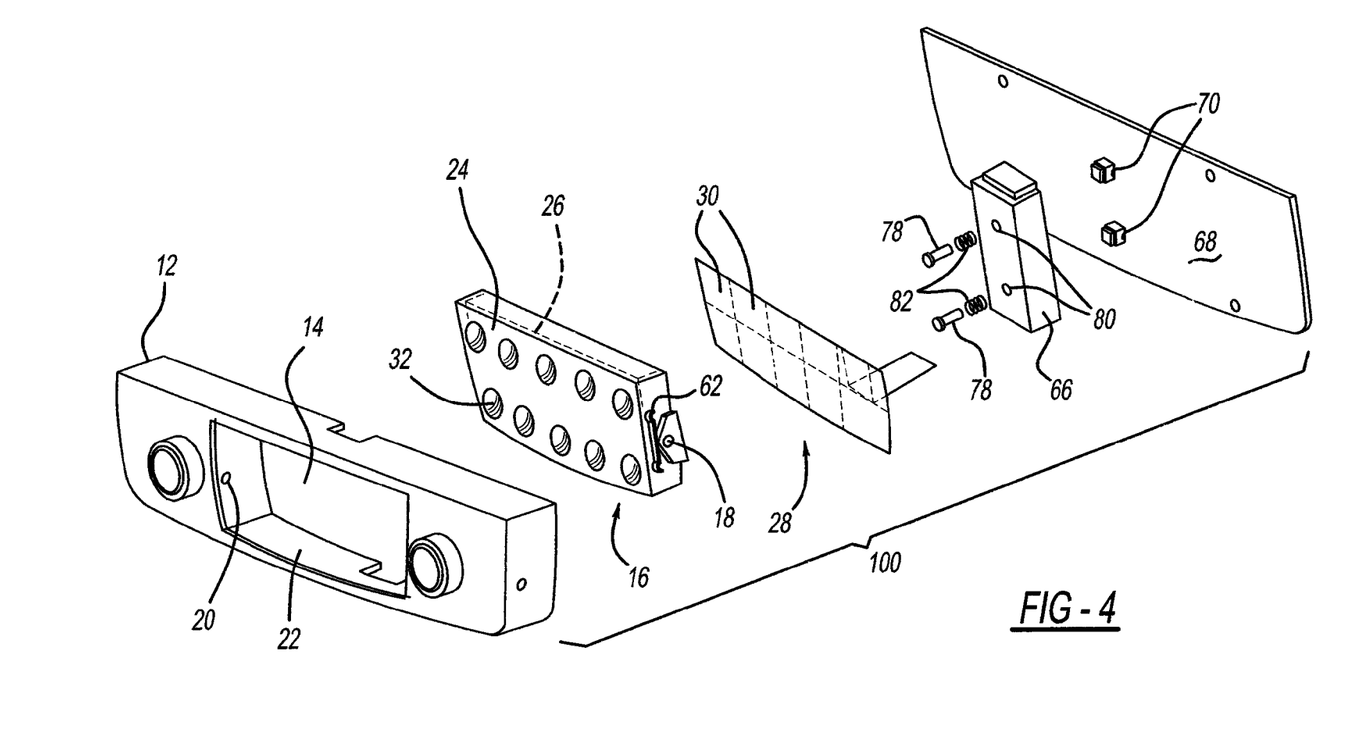
FIG. 4 is an exploded side perspective view of the composite rocker panel button arrangement in accordance with a second embodiment of the invention.
Figure 5A:
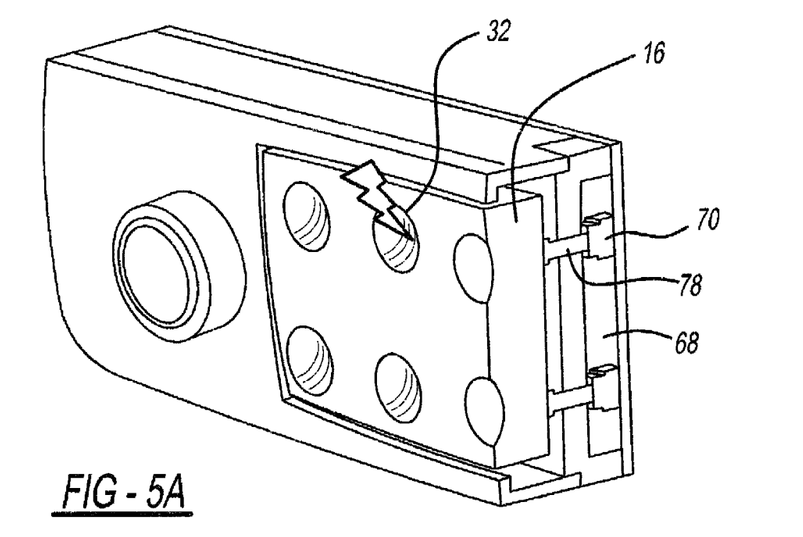
FIG. 5A is a cross-sectional side view of the composite rocker panel button arrangement of the second embodiment of the invention.
Figure 5B:
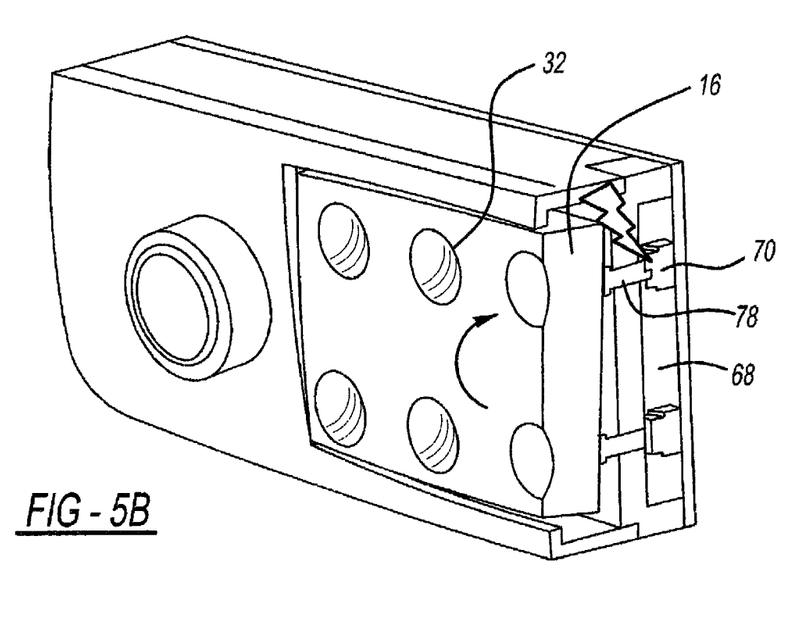
FIG. 5B is a perspective side cross-sectional view of the composite rocker button arrangement of the second embodiment of the invention.

Referring now to all the drawings, detailed description of the first and second embodiments of the invention are shown. In particular, FIGS. 2 and 3a-3b show a first embodiment of a composite rocker button arrangement 10 in accordance with the first embodiment of the invention. FIGS. 4, 5a and 5b show a second embodiment of a composite rocker button arrangement 100 in accordance with a second embodiment of the invention.

Referring now to both embodiments show in all of the Figures, the composite rocker button arrangement 10, 100 includes a bezel 12 having an opening 14. A rocker button 16 that is rotatably mounted within the opening 14. The rocker button 16 has protrusions 18 located at two ends, which are configured to align with and be rotatably located in respective apertures 20 formed on a flange 22 of the bezel 12. The rocker button 16 when connected to the flange 22 of the bezel 12 allows the rocker button 16 to rotate about an axis A-A. The rocker button 16 rotates or pivots between a neutral position shown in FIG. 3a, a first position shown in FIG. 3b, and a second position shown in FIG. 3c with regard to the first embodiment of the invention. With regard to the second embodiment of the invention the rocker button 16 rotates or pivots between a neutral position shown in FIG. 5a, a first position shown in FIG. 5b, and a second position shown in FIG. 5c.

Referring to both embodiments of the invention, the rocker button 16 further includes a viewing surface 24 that is placed within the opening 14 and is visible to a person operating the composite rocker button arrangement 10. The rocker button 16 also includes a back side 26 located within a hollow cavity of the rocker button 16.

A capacitive film 28 is connected to the back side 26 of the rocker button 16, within the hollow. The capacitive film 28 also includes one or more touch nodes 30 that align with dimples 32 formed on the viewing surface 24 of the rocker button 16. While the first and second embodiments of the invention show dimples 32 formed on the rocker button 16, it within the scope of this invention for there to not be any dimples, and the viewing surface 24 is just a flat or non-dimpled surface.

The various one or more touch nodes 30 on the capacitive film 28 are used to generate function signals when the capacitive film 28 is disrupted at a location of a specific one of the one or more touch nodes 30. Generation of the function signals is accomplished through a connection between the capacitive film 28 and a circuit board 34, 68 (circuit board in the second embodiment is labelled 68) that is connected to the back side of the bezel 12. The circuit board 34 is configured to facilitate the communication of signals from the composite rocker button arrangement 10, 100 to another controller to which the composite rocker button arrangement 10, 100 is being used in connection with. The composite rocker button arrangement 10, 100 can used in connection with a variety of different applications including, but are not limited to, vehicle infotainment systems, sound radio systems, environmental HVAC systems, communications, driver interface modules, global positioning systems, vehicle lighting, vehicle audio, or virtually any other type of system in a vehicle. It is also within the scope of this invention for the circuit board 34 to contain a controller or some other logic that allows for the processing and execution of the function signals generated when a person touches the one or more touch nodes 30 of the composite rocker button arrangement 10, 100.

Referring now to the first embodiment of the invention shown in FIGS. 1, 2, 3a, 3b, 3c, a chassis 36 is connected to and supports the capacitive film 28 and rocker button 16. The chassis 36 is connected to the back side 26 of the rocker button 16 and pivots with the rocker button 16 between the neutral position, first position, and second position. The chassis 36 has a perimeter frame portion 38 that supports the edges of the capacitive film 28.

The composite rocker button arrangement 10 in accordance with the first embodiment of the invention also includes a rocker actuator 40 that is connected between the chassis 36 and the circuit board 34. The rocker actuator 40 is operated by the pivoting of the rocker button 16 between the neutral position, first position, and second position. In particular, when the rocker button 16 moves from the neutral position as shown in FIG. 3a to the first position as shown in FIG. 3b, the rocker actuator 40 that operates in connection with the circuit board 34 to initiate a first secondary command signal. When the rocker button 16 pivots to the second position as shown in FIG. 3c, the rocker actuator 40 and circuit board 34 initiate a second secondary command signal in the second rotation direction.

Figure 3C:
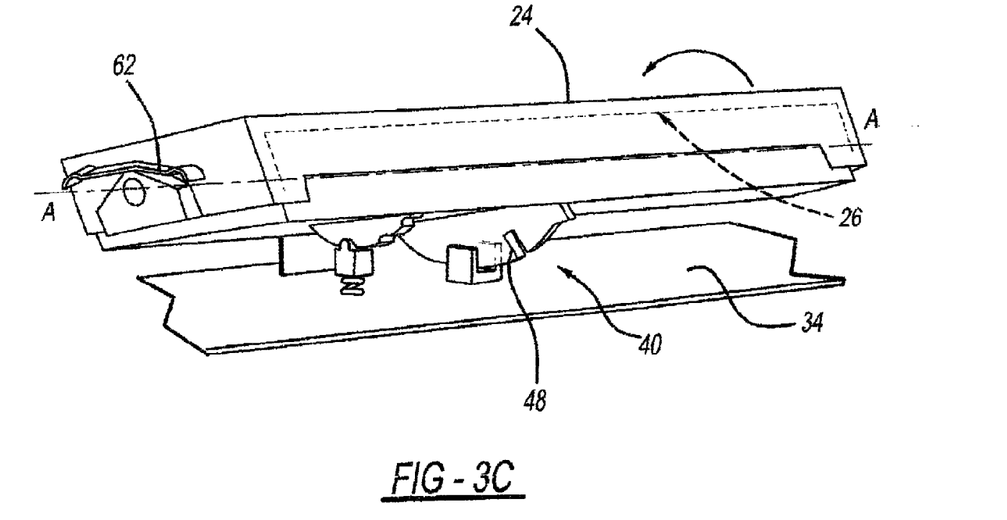
FIG. 3C is a partially sectioned side perspective view of the rocker panel button arrangement in accordance with the first embodiment of the invention.

Referring now to FIGS. 3a-3c, the rocker actuator 40 is shown in greater detail. In accordance with the first embodiment of the invention, the composite rocker button arrangement 10 includes an optical encoder 42 connected to the circuit board 34 that has a light beam extending between two sensors 44. The optical encoder 42 is capable of determining when the light beam has been blocked as well as the direction of disruption of the light beam. The chassis 36 has an arcuate tab 46 extending from the chassis 36 that is configured to rotate adjacent the optical encoder 42, such that the arcuate tab 46 passes through the optical encoder 42 when the rocker button 16 is rotated to the first position. The rotation of the rocker button 16 to the first position selectively disrupts the light beam of the optical encoder 42 and causes the generation of a first secondary command signal from the optical encoder 42. When the rocker button 16 is moved to the second position, the arcuate tab 46 will disrupt the light beam of the optical encoder 42 thereby causing the generation of a second command signal from the optical encoder 42. When the rocker button 16 is in the neutral position, the arcuate tab 46 has a gap 48 that allows for the light beam to pass through the gap so there will be no disruption and no secondary command signal will be generated.

In the first embodiment of the invention, the use of the optical encoder 42 and arcuate tab 46 eliminates any type of tactile feedback that a person pressing the rocker button 16 would feel since the rocker actuator 40 uses a type of technology that does not require any springs or detent like surfaces. Therefore, the first embodiment of the present invention further includes a pivotable plunger 50 connected to the circuit board 34 or bezel 12 and is able to pivot with respect to the plane of the circuit board 34. The pivotable plunger 50 has a cam follower 52 that contacts and slides on a cam surface 54 of a cam 56 extending from the chassis 36. It is also within the scope of this invention for the cam 56 to extend from the back side 26 of the rocker button 16 and extend past the chassis 36. The cam surface 54 has one or more detents 58 to cause the pivotable plunger 50 to pivot when the cam follower 52 encounters the detents 58 on the cam surface 54. There is also a spring 60 located beneath the cam follower 52 that presses the cam follower 52 onto the cam surface 54. The combination of the cam follower 52, pivotable plunger 50, cam surface 54 and the detents 58 cause a "click" feel or tactile feel when the rocker button 16 moves between the first position or the second position.

While two detents 58 are shown and described, it is within the scope of this invention for more or less detents to be used, it is also possible for the detents to have a different type of shape in order to provide a different type of tactile feedback. A series of small detents over a region of the cam surface 54 would give the rocker button 16 a bumpy or vibration like feel when the rocker button 16 is pressed. It is also possible to have detents of varying depth which would give the rocker button 16 a couple of different sensations when the rocker button is pivoted. When the rocker button 16 is moved from the first position or the second position back to the neutral position, the spring 60 causes the cam follower 52 to stay engaged with the cam surface and move back to a neutral state.

As described above, the rocker button 16 moves between a neutral position, first position, and second position as shown in FIGS. 3a-3c. When a user presses their finger onto the rocker button causing the rocker button to pivot to the first or the second position, the rocker button 16 is configured to automatically pivot back to the neutral position when a user removes their finger. In order to cause the automatic movement of the rocker button 16 from the first position or second position back to the neutral position, the first embodiment of the invention uses two leaf springs 62 that are connected between the rocker button 16 and bezel 12. Each of the leaf springs 62 are connected on angled ramps 64 formed on each end of the rocker button 16. The angled ramps 64 allow for each side of the leaf spring 62 to bend, while maintaining their position between the rocker button 16 and flange 22 of the bezel 12. When the rocker button 16 is moved from the neutral position to the first position or the second position, the leaf springs 62 will bend and be loaded so that when a user removes their finger, the leaf springs 62 will cause the rocker button 16 to pivot back to the neutral position in order to release the tension load of the leaf springs 62.

Operation of the composite rocker button arrangement 10 in accordance with the first embodiment of the present invention is as follows. The decorative surface of the composite rocker button 10 is capable of displaying an image on each of the one or more touch nodes 30 that correspond to various options that a user of the composite rocker button arrangement 10 may choose. The capacitive film 28 includes one or more touch nodes that are areas on the capacitive films that are used to generate function signals when the capacitive field is disrupted at the location of a specific one of the one or more touch nodes 30 of the capacitive film 28, thereby causing a primary signal to be sent to the circuit board. The disruption of the capacitive field region occurs when a user places their finger onto one of the dimples 32 on the viewing surface 24.

A user simply has to look at the viewing surface 24, decide which of the dimples 32 they would like to press in order to select one of the one or more touch nodes 30. Once a selection has been made, confirmation can be made by illumination of the selected touch node. The rocker button 16 may then be pivoted between the neutral position, first position, or second position in order to control a parameter of the selected mode that was highlighted when the user pressed the one or more touch nodes 30.

The composite rocker button arrangement 10 can be programmed to control any number of functions, including but not limited to radio controls, such as mode, volume, tuner, bass, treble, speaker controls, HVAC controls including temperature, fan speed, vent controls, telephone or media controls including DVD or video controls, window actuators, cruise controls, lights controls, etc. Control of the various functions is accomplished by programming the individual touch nodes 30 and the primary signals generated from the one or more touch nodes 30 and the second command signals generated by the movement of the rocker button 16.

The signals generated by the rocker button 16 movement and the one or more touch nodes 30 can be used in conjunction with each other or they can be used to control different functions independently. For example, the one or more touch nodes 30 in one embodiment is used to select certain functions or modes, such as a specific audio control such as a bass level command, the rocker button 16 can be used in connection with the one or more touch nodes 30 to adjust the bass setting. The rocker button 16 and the touch nodes 30 can also be used separately. In another example the touch nodes 30 are programmed to select preset radio stations, while the rocker button 16 is programmed to control audio volume.

With regard to the second embodiment of the invention shown in FIGS. 4, 5a and 5b, identical structures have been identified using the same reference numbers. The operation of the capacitive film 28 in the second embodiment of the composite rocker button arrangement 100 is the same as the first embodiment. Also the functions of the touch nodes 30 and the rocker button 16 can be programmed to the same purposes. The main difference is that the second embodiment does not use the optical encoder 42 and contains different components for sending signals by pivoting the rocker button 16. In the second embodiment of the invention, the composite rocker button arrangement 100 has a chassis 66 that is connected to a circuit board 68. The circuit board 68 has two or more tact switches 70 mounted to the circuit board, which are used to send or generate signals when activated. The chassis contains two or more tappets 78 that are connected through chassis apertures 80 and are aligned to make selectable contact with one of the tact switches 76.

When the rocker button 16 is pivoted from the neutral position to the first position, the back side 26 of the rocker button 16 presses one of the tappets 78 to actuate the respective one of the tack switches. Pivoting the rocker button 16 to the second position causes the back side 26 of the rocker button 16 to contact and move the second one of the tappets 78 to engage the second one of the tact switches on the circuit board in order to generate a second command signal.

Figure 5C:
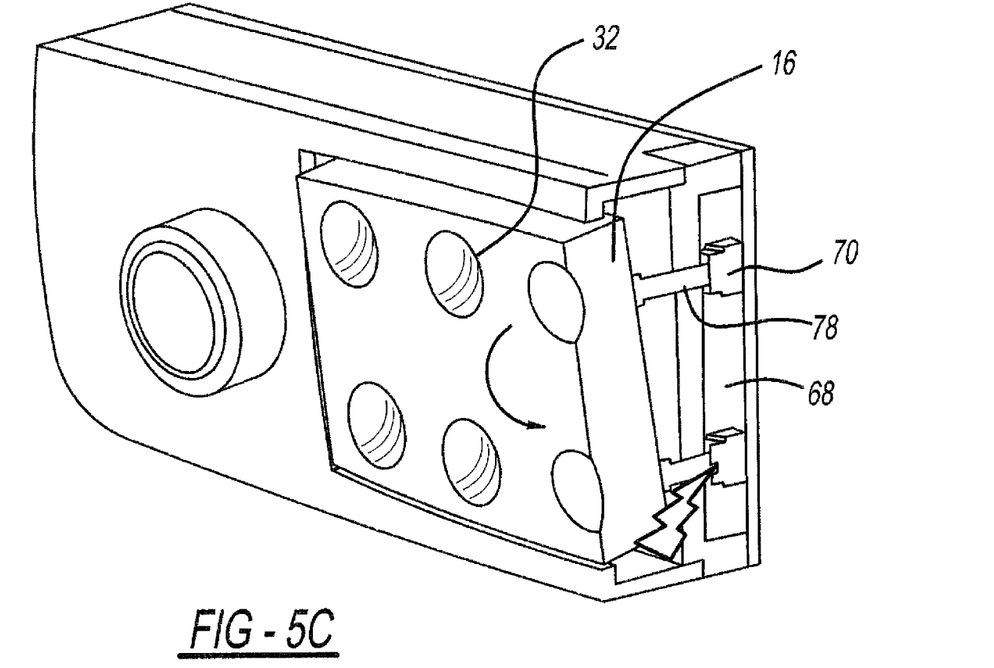
FIG. 5C is a perspective side cross-sectional view of the composite rocker button arrangement of the second embodiment of the invention.

Each of the tappets has a spring 82 contained within the chassis apertures 80 that cause the tappets 78 to move between an engaged position where the tappet 78 is making contact with its respective tact switch 76, to a disengaged position where the tappet 78 is not making contact with the tack switch 76. The springs 82 also cause the rocker button 16 to pivot between the first position, second position and to the neutral position, which eliminates the need for having the leaf springs 62. However, an optional feature of the second embodiment is to also include the leaf springs 62 as shown, which will operate in a manner identical to the first embodiment. FIGS. 5a and 5b show a cross-sectional diagram of the movement of the rocker button 16 between the first position as shown in FIG. 5b, and the neutral position as shown in FIG. 5a. FIG. 5a also show where one of the dimples 32 is selected prior to moving the rocker button 16 and the rocker button 16 is in the neutral position. FIG. 5B shows the rocker button 16 moved to the first position engaging a first one of the tappets 18 with the respective tact switch 70 on the circuit board 68. FIG. 5C shows the rocker button 16 moved to the second position engaging a second one of the tappets 18 with the respective tact switch 70 on the circuit board 68.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A composite rocker panel button arrangement comprising:
   a bezel having an opening;
   a rocker button rotatably mounted to the bezel and located within the opening, said rocker button being pivotable about an axis between a neutral position, a first position in a first direction relative to the neutral position, and a second position, in a direction opposite the first direction and said rocker button has a viewing surface and a back side;
   a capacitive film connected to said back side of said rocker button, said capacitive film includes one or more touch nodes that are areas on the capacitive films that are used to generate primary function signals when the capacitive field is disrupted at the location of a specific one of the one or more touch nodes;

a chassis is connected to and supports said capacitive film and said chassis being connected to said rocker button;
a circuit board connected to the bezel adjacent the chassis, said circuit board is connected to the capacitive film; and
a rocker actuator connected between said chassis and said circuit board, wherein said rocker actuator is operated by the pivoting of the rocker button and when the rocker button moves to the first position, the rocker actuator and circuit board initiate a first secondary command signal, and when the rocker button pivots to the second position, the rocker actuator and the circuit board initiate a second secondary command signal, said rocker actuator comprising an optical encoder connected to the circuit board and an arcuate tab formed on said chassis configured to rotate adjacent the optical encoder;
wherein the optical encoder has a light beam extending between two sensors capable of determining when the light beam has been blocked,
wherein the arcuate tab passes through the optical encoder when the rocker button is rotated to the first position, thereby selectively disrupting the light beam of the optical encoder and generating the first secondary command signal and when the rocker button is moved to the second position the arcuate tab will disrupt the light beam of the optical encoder, thereby causing the generation of the second secondary command signal to the circuit board.

2. The composite rocker panel button arrangement of claim 1 wherein the one or more touch nodes that are areas on the capacitive films that are used to generate function signals when the capacitive field is disrupted at the location of a specific one of the one or more touch nodes of the capacitive film, thereby causing a primary signal to be sent to the circuit board.

3. The composite rocker panel button arrangement of claim 1 further comprising a pivotable plunger connected to the circuit board or bezel and a spring connected to the pivotable plunger for providing a tactile feedback feel when the rocker button is rotated from the neutral position to the first position or the second position.

4. The composite rocker panel button of claim 3 further comprising a cam extending from the back side of the rocker button or from the chassis; one or more detents on the cam surface; and a cam follower on the pivotable plunger that is configured to slide on the cam surface and contact the one or more detents.

5. The composite rocker panel button arrangement of claim 1 further comprising one or more leaf springs connected between the rocker button and the bezel, wherein the one or more leaf springs are configured to bend when the rocker button is rotated between the first position and the second position and then cause the rocker button to move to the neutral position when no force is acting on the rocker button causing the rocker button to rotate to the first position or the second position.

6. A composite rocker panel button arrangement comprising:
a bezel having an opening;
a rocker button rotatably mounted to the bezel and located within the opening, said rocker button being pivotable about an axis between a neutral position, a first position, and a second position and said rocker button has a viewing surface and a back side;
a capacitive film connected to said back side of said rocker button, said capacitive film includes one or more touch nodes that are areas on the capacitive films that are used to generate function signals when the capacitive field is disrupted at the location of a specific one of the one or more touch nodes;
a chassis is connected to and supports said capacitive film and said chassis being connected to said rocker button;
a circuit board connected to the bezel adjacent the chassis, said circuit board is connected to the capacitive film; and
a rocker actuator connected between said chassis and said circuit board, wherein said rocker actuator has an optical encoder connected to the circuit board and an arcuate tab formed on said chassis configured to rotate adjacent the optical encoder, wherein the optical encoder has a light beam extending between two sensors capable of determining when the light beam has been blocked, wherein the arcuate tab passes through the optical encoder when the rocker button is rotated from the neutral position to the first position, thereby selectively disrupting the light beam of the optical encoder and generating a first secondary command signal and when the rocker button is moved to the second position the arcuate tab will disrupt the light beam of the optical encoder, thereby also causing the generation of a second secondary command signal to the circuit board.

7. The composite rocker panel button arrangement of claim 6 wherein said optical encoder determines the direction in which the arcuate tab passes through the light beam by sending the direction of light beam disruption in order to determine whether the first command signal or the second secondary command signal will be generated.

8. The composite rocker panel button arrangement of claim 6 wherein the one or more touch nodes that are areas on the capacitive films that are used to generate function signals when the capacitive field is disrupted at the location of a specific one of the one or more touch nodes of the capacitive film, thereby causing a primary signal to be sent to the circuit board.

9. The composite rocker panel button arrangement of claim 6 further comprising a pivotable plunger connected to the circuit board or bezel and a spring connected to the pivotable plunger for providing a tactile feedback feel when the rocker button is rotated from the neutral position to the first position or the second position.

10. The composite rocker panel button of claim 9 further comprising a cam extending from the back side of the rocker button or from the chassis; one or more detents on the cam surface; and a cam follower on the pivotable plunger that is configured to slide on the cam surface and contact the one or more detents.

11. The composite rocker panel button arrangement of claim 6 further comprising one or more leaf springs connected between the rocker button and the bezel, wherein the one or more leaf springs are configured to bend when the rocker button is rotated between the first position and the second position and then cause the rocker button to move to the neutral position when no force is acting on the rocker button causing the rocker button to rotate to the first position or the second position.

* * * * *